US008471535B2

(12) United States Patent
Kora et al.

(10) Patent No.: US 8,471,535 B2
(45) Date of Patent: Jun. 25, 2013

(54) LARGE CURRENT HANDLING CAPABLE SEMICONDUCTOR SWITCHING DEVICE WITH SUPPRESSION OF SHORT CIRCUIT DAMAGE AND RECOVERY CURRENT SWITCHING LOSS

(75) Inventors: Masayuki Kora, Tokyo (JP); Mitsuharu Tabata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 726 days.

(21) Appl. No.: 12/650,908

(22) Filed: Dec. 31, 2009

(65) Prior Publication Data

US 2010/0213915 A1    Aug. 26, 2010

(30) Foreign Application Priority Data

Feb. 23, 2009  (JP) .................................. 2009-039507

(51) Int. Cl.
  *G05F 1/46*  (2006.01)
(52) U.S. Cl.
  USPC .............................. 323/222; 323/351; 363/124
(58) Field of Classification Search
  USPC ................... 323/222, 272, 282, 351; 363/98, 363/124, 132
  See application file for complete search history.

(56) References Cited

U.S. PATENT DOCUMENTS

| 5,084,662 | A  | * | 1/1992 | Palaniappan et al. | .......... | 318/701 |
| 7,202,649 | B2 | * | 4/2007 | Bird et al. | ..................... | 323/282 |
| 2008/0284482 | A1 |   | 11/2008 | Ishikawa | | |
| 2010/0213915 | A1 | * | 8/2010 | Kora et al. | ..................... | 323/290 |
| 2010/0214710 | A1 | * | 8/2010 | Kora | ............................. | 361/101 |
| 2011/0116294 | A1 | * | 5/2011 | Wolf | .............................. | 363/132 |
| 2011/0273159 | A1 | * | 11/2011 | Tabata | ......................... | 323/311 |

FOREIGN PATENT DOCUMENTS

| DE | 10 2005 019 571 A1 | 11/2006 |
| JP | 59-86499 | 5/1984 |
| JP | 61-147780 | 7/1986 |
| JP | 6-351289 | 12/1994 |
| JP | 8-172793 | 7/1996 |
| JP | 8-205581 | 8/1996 |
| JP | 8-223936 | 8/1996 |
| JP | 9-163792 | 6/1997 |
| JP | 10-337084 | 12/1998 |
| JP | 11-51977 | 2/1999 |
| JP | 2000-295891 | 10/2000 |
| JP | 2000-299996 | 10/2000 |
| JP | 2000-341965 | 12/2000 |
| JP | 2001-157490 | 6/2001 |
| JP | 2001-245479 | 9/2001 |
| JP | 2001-346384 | 12/2001 |

(Continued)

OTHER PUBLICATIONS

Chinese Office Action issued Mar. 29, 2012 in Patent Application No. 201010131823.X with Partial English Translation.

(Continued)

*Primary Examiner* — Jeffrey Sterrett
(74) *Attorney, Agent, or Firm* — Oblon, Spivak, McClelland, Maier & Neustadt, L.L.P.

(57) ABSTRACT

A semiconductor switching device includes a power control part, which includes a voltage dropping chopper circuit having a first switching element and a first diode, a voltage boosting chopper circuit having a second switching element and a second diode, and an inductance. And the inductance is connected such that an unusual current caused by the arm short circuit is forced to pass through the inductance.

3 Claims, 6 Drawing Sheets

FOREIGN PATENT DOCUMENTS

| | | |
|---|---|---|
| JP | 2002-281784 | 9/2002 |
| WO | WO 91/03104 | 3/1991 |

OTHER PUBLICATIONS

Notification of Reason for Rejection issued Jan. 8, 2013 in Japanese Patent Application No. 2009-039507 (with English translation).

Office Action issued Oct. 22, 2012 in Chinese Patent Application No. 201010131823.X (with partial English-language translation).

Office Action dated Apr. 7, 2013 in Chinese Patent Application No. 201010131823.X (with partial English-language translation).

* cited by examiner

LARGE CURRENT HANDLING CAPABLE SEMICONDUCTOR SWITCHING DEVICE WITH SUPPRESSION OF SHORT CIRCUIT DAMAGE AND RECOVERY CURRENT SWITCHING LOSS

BACKGROUND OF THE INVENTION

1. Field of the Invention

The present invention relates to a semiconductor switching device for controlling voltage to be applied to a load.

2. Background Art

A semiconductor switching device has been used, such as an inverter for controlling a rotating speed of a motor, or a half bridge circuit which is provided for an inverter bridge circuit used as, for example, an AC source. A power element such as a power MOSFET or an IGBT (Insulated Bipolar Gate Transistor) is used as a semiconductor element since the semiconductor element used in the semiconductor switching device needs to handle a large current.

A load is subject to being controlled by the semiconductor switching device and is connected to an AC source via the semiconductor switching device. The switching element, which is provided to the semiconductor switching device, performs a switching operation according to a driving signal produced by a control circuit such that desired control of the load is accomplished. A chopping current carrying device disclosed in the Japanese Laid-Open Patent Publication No. 8-172793 is an example of the semiconductor switching device.

For converting a power between DC and AC by using a general-purpose inverter, which is one type of the semiconductor switching device, it is common to prepare a plurality of units each having two switching elements connected in series with a DC source, and the load is connected to a midpoint between the two switching elements. There may arise a problem wherein the DC source is short circuited by the two switching elements (this short circuit of the DC source is called as an arm short circuit, hereinafter), since the two switching elements are switched into an ON state simultaneously due to such as a malfunction.

The arm short circuit is a serious problem because it damages the switching element. To suppress that negative effect, a protection circuit may be provided so as to shut off the switching elements when detecting that a temperature of the switching elements becomes higher than a predetermined temperature due to the arm short circuit. However, the switching elements should be shut off in a very short period of time, such as less than several micro-seconds, after the arm short circuit occurs so as to prevent the degradation of the switching element. There arises a problem of the difficulty in ensuring the safe shut off of the switching elements since shutting off the switching elements in a very short period of time is difficult. Moreover, detecting the arm short circuit in a short period of time and shutting off the switching elements quickly may be difficult depending on the circuit configuration.

For the period of the off state of the switching elements, a diode is often provided to the semiconductor switching device so as to release energy stored in the load that is accumulated during the operation. Such diode is used to release energy stored in the load. However, when the switching elements switched to on state again, there arises a problem of a switching loss caused by the recovery current that is generated in the diode.

Further, there exists a semiconductor switching device in which a plurality of semiconductor elements is connected in parallel with each other so as to handle a large current. When the semiconductor elements are connected in parallel with each other, there arises a problem of increase of the inductance between the chips. Namely, when a plurality of the switching elements and the diodes are mounted on a substrate for the purpose of handling a large current, inductance of a wiring that connects chips is increased.

Basically, the wiring inductance is proportional to a size of the substrate. Thus, the inductance is increased when many switching elements are connected in parallel so as to handle a large current. Further, as the inductance increased, di/dt is also increased. Accordingly, a back electromotive force voltage, which is the product of the inductance and the di/dt, is increased when a lot of switching elements are connected in parallel, thereby causing a problem of lowering the switching speed. To get around this situation, the switching elements and the diodes may be mounted closely adjacent each other to the substrate so as to decrease the wiring inductance. However, when the switching elements and the diodes are mounted closely adjacent each other, there arises a problem of the obstruction of radiation of heat, for example, from the semiconductor elements.

SUMMARY OF THE INVENTION

In view of the above-described problems, objects of the present invention is to provide a semiconductor switching device in which the damage to the switching elements due to the arm short circuit is suppressed, the switching loss due to the recovery current of the diode is suppressed, and capable of handling a large current.

According to one aspect of the present invention, a semiconductor switching device includes a power control part, which includes a voltage dropping chopper circuit having a first switching element and a first diode, a voltage boosting chopper circuit having a second switching element and a second diode, and an inductance. A first end of the first switching element is connected to a high voltage side of a power source, a second end of the first switching element is connected to a cathode of the first diode, an anode of the first diode is connected to a low voltage side of the power source, a cathode of the second diode is connected to the first end of the first switching element, an anode of the second diode is connected to a first end of the second switching element, a second end of the second switching element is connected to the anode of the first diode, a first end of the inductance is connected to the second end of the first switching element and a second end of the inductance is connected to the first end of the second switching element, and a load is connected to the second end of the first switching element or the first end of the second switching element.

According to another aspect of the present invention, a semiconductor switching device includes a voltage dropping chopper circuit which includes a switching element, a diode, and a free wheeling diode whose cathode is connected to a cathode of the diode via a first inductance and whose anode is connected to a anode of the diode via a second inductance. A first end of the switching element is connected to a high voltage side, a second end of the switching element is connected to a cathode of the diode, an anode of the diode is connected to the a voltage side, the second end of the switching element is connected to a load, and the load is connected to the low voltage side.

According to another aspect of the present invention, a semiconductor switching device includes a voltage boosting circuit which includes a switching element, a diode, and a free wheeling diode whose cathode is connected to a cathode of the diode via a first inductance and whose anode is connected to a anode of the diode via a second inductance. The cathode of the diode is connected to a high voltage side, the anode of the diode is connected to a first end of the switching element, a second end of the switching element is connected to a low voltage side, the first end of the switching element is connected to a load, and the load is connected to the high voltage side.

Other and further objects, features and advantages of the invention will appear more fully from the following description.

DETAILED DESCRIPTION OF THE PREFERRED EMBODIMENTS

First Embodiment

Figure 1:
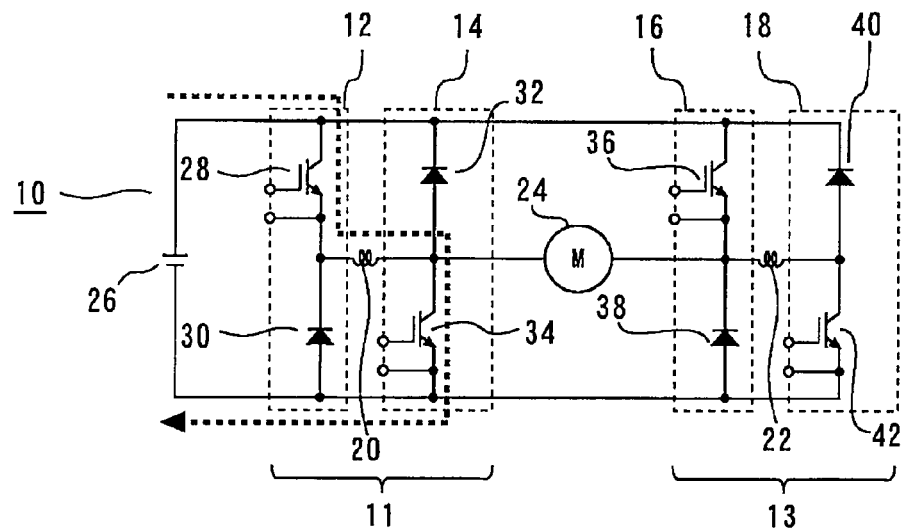
FIG. 1 is a circuit diagram of the semiconductor switching device of the first embodiment.

The first embodiment of the present invention will now be described with reference to FIGS. 1 to 3. Like materials and elements are designated by the same reference numerals and may not be redundantly described. This is also true for the other embodiments of the present invention.

FIG. 1 is a circuit diagram of a semiconductor switching device according to the first embodiment. A first power control part 11 and a second power control part 13 are provided with the semiconductor switching device 10. The first power control part 11 and the second power control part 13 are a half bridge circuit, respectively. Further, the first power control part 11 and the second power control part 13 are connected to a load 24 that is subject to control. The load 24 of the present embodiment may be made of, but is not limited to, a motor. The load 24 is connected to a DC source 26 via the semiconductor switching device 10 that consists of the first power control part 11 and the second power control part 13.

Here, the configuration of the first power control part 11 is explained. A first voltage dropping chopper circuit 12, a first voltage boosting chopper circuit 14 and an inductance 20 are provided with the first control part 11. In FIG. 1, the first voltage dropping chopper circuit 12 and the first voltage boosting chopper circuit 14 are individually surrounded by the broken lines. As understood from FIG. 1, the first voltage dropping chopper circuit 12 includes a first switching element 28 whose first end is connected to a high voltage side of the DC source 26 and whose second end is connected to a cathode of a first diode 30. An anode of the first diode 30 is connected to a low voltage side of the DC source 26. Here, the high voltage side of the DC source 26 is simply called as a high voltage side and the low voltage side of the DC source 26 is simply called as a low voltage side, hereinafter.

The first voltage boosting chopper circuit 14 includes a second diode 32 whose cathode is connected to the high voltage side and whose anode is connected to a first end of a second switching element 34. A second end of the second switching element 34 is connected to the low voltage side.

A first end of the inductance 20 is connected to the second end of the first switching element 28, and a second end of the inductance 20 is connected to the first end of the second switching element 34. This completes the description of the configuration of the first power control part 11.

Next, the configuration of the second power control part 13 is explained. A second voltage dropping chopper circuit 16, a second voltage boosting chopper circuit 18 and an inductance 22 are provided with the second power control part 13. In FIG. 1, the second voltage dropping chopper circuit 16 and the second voltage boosting chopper circuit 18 are individually surrounded by the broken lines. As understood from FIG. 1, the second voltage dropping chopper circuit 16 includes a third switching element 36 whose first end is connected to the high voltage side and whose second end is connected to a cathode of a third diode 38. An anode of the third diode 38 is connected to the low voltage side.

The second voltage boosting chopper circuit 18 includes a fourth diode 40 whose cathode is connected to the high voltage side and whose anode is connected to a first end of a fourth switching element 42. A second end of the fourth switching element 42 is connected to the low voltage side.

A first end of the inductance 22 is connected to a second end of the third switching element 36, and a second end thereof is connected to the first end of the fourth switching element 42. This completes the description of the configuration of the second power control part 13.

A first end of the load 24 is connected to a middle point between the anode of the second diode 32 and the first end of the second switching element 34. A second end of the load 24 is connected to a middle point between the second end of the third switching element 36 and the cathode of the third diode 38. Thus, in the semiconductor switching device 10 of this embodiment, the first power control part 11 and the second power control part 13 together forms a bridge circuit so as to control the load 24.

Figure 2:
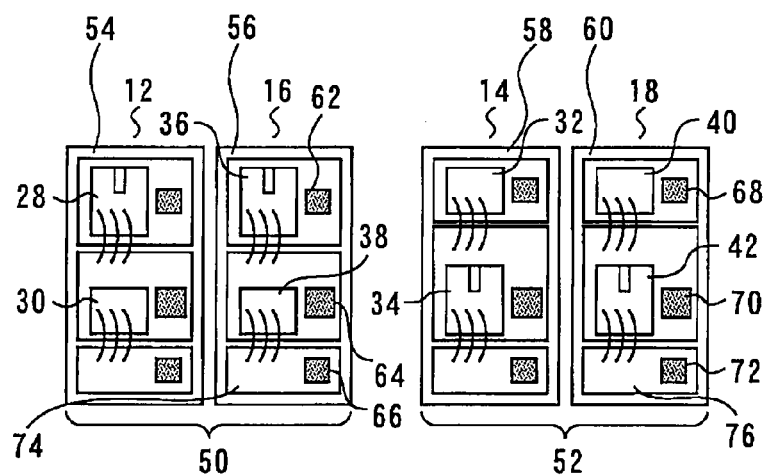
FIG. 2 shows the substrates.

FIG. 2 is a plan view of the semiconductor switching device 10 of the present embodiment for explaining the chip layout thereof. A chip of the first switching element 28 and a chip of the first diode 30, both provided to the first voltage dropping chopper circuit 12, are mounted on a first voltage dropping chopper circuit substrate 54. Similarly, a chip of the third switching element 36 and a chip of the third diode 38, both provided to the second voltage dropping chopper circuit 16, are mounted on a second voltage dropping chopper circuit substrate 56.

Similarly, a chip of the second switching element 34 and a chip of the second diode 32, both provided to the first voltage boosting chopper circuit 13, are mounted on a first voltage boosting chopper circuit substrate 58. Similarly, a chip of the fourth switching element 42 and a chip of the fourth diode 40, both provided to the second voltage boosting chopper circuit 18, are mounted on a second voltage boosting chopper circuit substrate 60. As seen above, the first power control part 11 and the second power control part 13, both provided to the semiconductor switching device 10 of this embodiment, are mounted on the substrates such that each chopper circuits independently mounted on the substrates.

Here, the operation of the semiconductor switching device 10 according to the present embodiment will be described.

When the first switching element 28 and the fourth switching element 42 are set in the on state so as to execute PWM control of the load 24, which is assumed to be motor in this embodiment, the electric current flows from the DC source 26 through the first switching element 28, the load 24, and the fourth switching element 42. Next, when the first switching element 28 is set in the off state, the energy stored in the load 24 is released as a freewheeling current that pass through the fourth switching element 42 and the first diode 30.

Next, the first switching element 28 is set in the on state again. At this time, a recovery current flows through the first diode 30. Further, the second switching element 34 and the third switching element 36 are set in the on state for passing a current through the load 24 in opposite direction. In this case, the freewheeling current flows through the second diode 32 and the third diode 38.

In addition to the normal operation of the semiconductor switching device 10 as described above, two switching elements connected in series with the DC source 26 may be set in the ON state simultaneously due to the erroneous signal or malfunction or the like. This is called as the arm short circuit, namely in the configuration of the present embodiment, the arm short circuit denotes the state in which the first switching element 28 and the second switching element 34 are set in the ON state simultaneously, or the state in which the third switching element 36 and the fourth switching element 42 are set in the ON state simultaneously. In this embodiment, the inductance 20 is placed between the first switching element 28 and the second switching element 34, and the inductance 22 is placed between the third switching element 36 and the fourth switching element 42.

According to the semiconductor switching device 10 of this embodiment, an unusual current caused by the arm short circuit is forced to pass through the inductance 20 or the inductance 22. Therefore, above mentioned unusual current is suppressed by the inductance 20 or the inductance 22, and the voltage applied to the switching elements can be shared by the inductance 20 and the inductance 22. Namely, it is unlikely that the high voltage would be applied to the switching element. According to the configuration of the semiconductor switching device 10 of the present embodiment, safe shut off of the switching elements can be ensured by extending the shut off time for the switching elements when the arm short circuit has occurs, since the unusual current passing through the switching element is suppressed.

Further, as explained with reference to FIG. 2, the first voltage dropping chopper circuit 12 and the first voltage boosting chopper circuit 14 (or the second voltage dropping chopper circuit 16 and the second voltage boosting chopper circuit 18) are formed on the different substrate. The wiring inductance can be reduced by independently mounting each chopper circuits on the substrates and connecting the chips of the switching element and the diode by wirings compared to the case that a plurality of the chopper circuits are mounted on a substrate and the chips are connected by the wirings.

Here, the voltage dropping chopper circuit and the voltage boosting chopper circuit were usually mounted on a single substrate, and chips had to be mounted closely adjacent each other on the substrate for the purpose of the wiring inductance reduction. However, in this embodiment, the wiring inductance can be easily reduced since the area required for the wire connection can be reduced by mounting each chopper circuits independently on the substrates. Further, the chips can be arranged from the viewpoint of the heat radiation since the switching elements and the diodes are no longer required to be mounted closely adjacent each other for the purpose of the wiring inductance reduction.

Although the present embodiment has been described with reference to the half bridge circuit, the present invention is not limited to this. The advantage of this embodiment is that, when two switching elements are in the state of the arm short circuit, the unusual current can be suppressed by using the inductance. This advantage is obtained by providing the inductance between the voltage dropping chopper circuit and the voltage boosting chopper circuit, and is based on the consideration that the power control part (the first power control part 11 or the second power control part shown in FIG. 1) can be perceived as a combination of the parallel connected voltage dropping chopper circuit and voltage boosting chopper circuit. Therefore, the semiconductor switching device is not limited to the half bridge circuit, and can be made up of, for example, a three-phase AC inverter circuit.

In this embodiment, a switching frequency of the switching element has not been limited. However, the switching element connected to the load 24 via the inductance 20 or the inductance 22 can be switched at higher average switching frequency than that of the other switching element. Namely, the first switching element 28 or the fourth switching element can preferably be switched at higher switching frequency compared to that of the second switching element 34 or the third switching element 36.

Here, the load or the wiring that extends to the load may have a capacitance. A dv/dt current which is caused by the voltage shift according to the switching operation may flow through the above mentioned capacitance. It is preferable to reduce the dv/dt current since it increases the switching loss. The switching loss can be reduced by increasing the average switching frequency of the first switching element 28 or the fourth switching element, whose dv/dt current is limited by the inductance, compared to increasing the average switching frequency of the second switching element 34 or the third switching element 36. Accordingly, it is preferable to provide a control device that increases the average switching frequency of the switching element which is connected to the load via the inductance compared to that of the other switching element.

Figure 4:
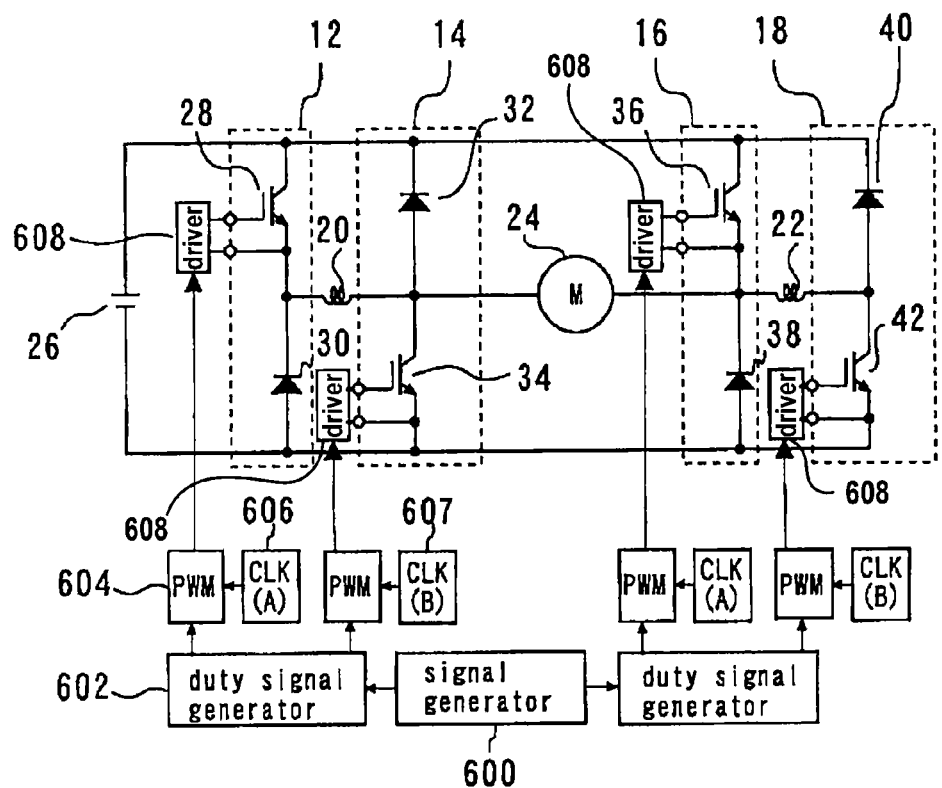
FIG. 4 is a diagram that explains the switching frequency.

The discussion concerning the switching frequency will be described here in detail. The method of applying a voltage with predetermined waveform to two electrodes of the load in the single inverter bridge circuit of this embodiment will be explained. This is explained with reference to FIG. 4. FIG. 4 shows a portion for transmitting a signal to gate drive circuits 608 in addition to the configuration of the semiconductor switching device 10 explained with reference to FIG. 1. The following procedure is used before the voltage with predetermined waveform is applied to the load 24.

Firstly, a voltage to be applied to each electrode of the load 24 at a certain time is set in a signal generator 600. This is performed so that the necessary voltage is applied to each electrode of the load 24. Although the combination of the voltages, which could be applied to each electrodes of the load 24 at the certain time, exists innumerably since the half bridge circuit allows setting voltage between high voltage of the DC source 26 and the low voltage thereof arbitrarily, there is no limitation on the combination of the voltages.

Next, information regarding the voltage to be applied to each electrodes of the load 24, which has set in the signal generator 600, is transmitted to a duty signal generator 602. When receiving this information, the duty signal generator 602 determines a duty (ratio of an ON period to an OFF period). Then, a PWM signal corresponding to the duty is generated in a PWM signal generator 604 so as to be transmitted to the gate drive circuit 608. Finally, the control of the switching element is performed according to the duty. The sum of the ON period and the OFF period concerning the duty may be any value. Therefore, the sum of the ON period and the OFF period at the certain time is not necessarily coincident with that of another time and is not necessarily synchronized with the other phase.

Specifically, for example, the sum of the ON period and the OFF period of the first voltage dropping chopper circuit is not need to be synchronized with that of the first voltage boosting chopper circuit 14, since the arm short circuit of the semiconductor switching device 10 is suppressed by the inductance 20 and 22. That is it is preferable in general that the voltage dropping chopper circuit and the voltage boosting chopper circuit are synchronized each other such that the frequency of the voltage dropping chopper circuit is substantially equal to an integral multiple of the frequency of the voltage boosting chopper circuit. This is applicable even to the semiconductor switching device 10 of the present embodiment. However, that is not necessarily required to the present embodiment because of the described advantage achieved by the inductance 20, 22. Also, a clock frequency is not required to be constant since the sum of the ON period and the OFF period is not required to be constant at different time points.

The word "high" or "low" switching frequency can be interpreted as a difference between a frequency of a clock A 606 and that of a clock B 607, or interpreted as a difference between a time-averaged frequency of the clock A 606 and that of the clock B 607.

The method of applying the voltage having predetermined waveform to the two electrodes of the load 24 is basically as described above. However, the advantages of the present embodiment can be obtained even when the method or the configuration is different from that of this embodiment as long as a logic circuit or an algorithm is constructed so as to result a signal processing that is equivalent as a whole to the above described one.

In this embodiment, each of the voltage dropping/boosting chopper circuits is individually mounted on a different substrate as explained with reference to FIG. 2. Although each of the voltage dropping chopper circuits or each of the voltage boosting chopper circuits are individually mounted on a different substrate, the voltage dropping chopper circuits may be collectively mounted on a substrate and the voltage boosting chopper circuits may be collectively mounted on a substrate. Such example is shown in FIG. 3.

Figure 3:
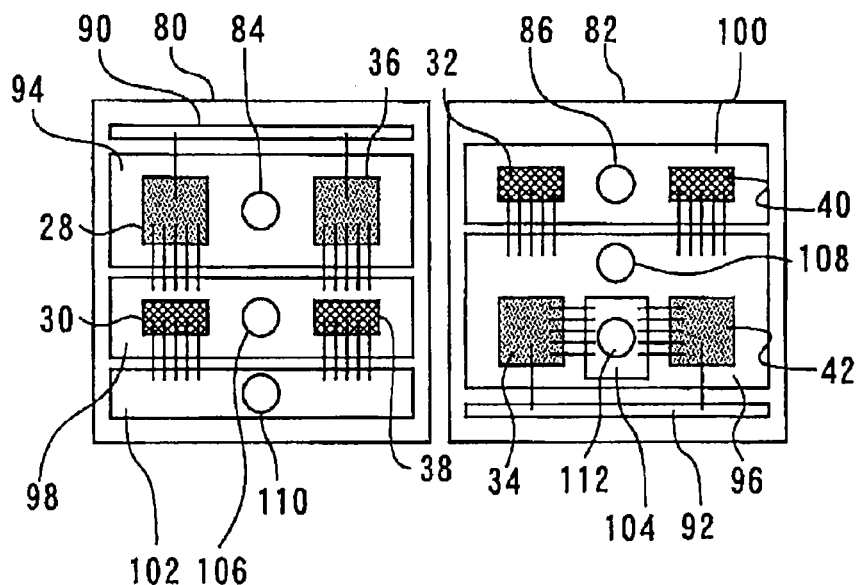
FIG. 3 shows another example of the substrates.

According to the configuration of FIG. 3, a chip for the first voltage dropping chopper circuit 12 and a chip for the second voltage dropping chopper circuit 16 are mounted on a voltage dropping chopper circuit substrate 80 on which a gate pattern 90, a collector pattern 94, a cathode pattern 98, and a N-side pattern 102 are formed. Similarly, a chip for the first voltage boosting chopper circuit 14 and a chip for the second voltage boosting chopper circuit 18 are mounted on a voltage boosting chopper circuit substrate 82 on which a gate pattern 92, a collector pattern 96, a cathode pattern 100, and an N-side pattern are formed.

The connection part for connecting the voltage dropping chopper circuit 80 with the outside is explained as follows. First, a P-terminal connection part 84 is disposed between the first switching element 28 and the third switching element 36. An output terminal connection part 106 is disposed between the first diode 30 and the third diode 38. Also, an N side terminal connection part 110 is displaced on the N side pattern 102.

On the other hand, the connection part for connecting the voltage boosting chopper circuit 82 with the outside is explained as follows. First, an N-terminal connection part 112 is disposed between the second switching element 34 and the fourth switching element 42. A P-terminal connection part 86 is disposed between the second diode 32 and the fourth diode 40. An output terminal connection part 108 is disposed onto the collector pattern 96 and between the N-terminal connection part 112 and the P-terminal connection part 86

As described, even when a plurality of switching elements and a plurality of diodes are collectively disposed on a substrate, the distance between the chips can be maintained by disposing the connection parts, which are to be connected to the outside, between the switching elements or between the diodes. That is, the problem of heat radiation would be suppressed since the chips are separately disposed while the necessary parts are disposed on the voltage dropping/boosting chopper circuit substrates so as to minimize the area of the chip. Generally, distance between those kind of substrates is not so small that the problem of the heat radiation is not induced.

Although the inductance 20 and 22 are provided in this embodiment as shown in FIG. 1, the present invention is not limited to this. A wiring inductance can be used instead of the inductance 20 and 22 without losing the advantages of this invention. Namely, the advantages of this invention can be obtained by extending the length of the wiring which connects the midpoint between the first switching element 28 and the first diode 39 with the midpoint between the second switching element 34 and the second diode 32 (this wiring is referred to as an intermediate wiring) so as to increase the wiring inductance to the extent that the advantages of this invention can be obtained. Specifically, predetermined wiring inductance is obtained by extending the intermediate wiring longer than a wiring for the P-terminal or a wiring for the N-terminal.

The "wiring for the P-terminal" denotes a wiring which connects the P-terminal connection part (high voltage side of a source) of the first switching element 28 with the P-terminal connection part of the second diode 32. Further, the "wiring for the N-terminal" denotes a wiring which connects the N-terminal connection part (low voltage side of the source) of the second switching element 34 with the N-terminal connection part 66 of the first diode 30.

A rapid increase of the unusual current during the arm short circuit can be suppressed by a practically meaningful level by extending the length of the intermediate wiring such that the wiring inductance of the intermediate wiring is more than twice as great as that of the wiring for the P-terminal or the wiring for the N-terminal. Although the first power control part 11 has been described, the same configuration is also applicable for the second power control part 13. The same effect can be obtained when the intermediate wiring is extended so as to be longer than the wiring which connects the chips.

Figure 5:
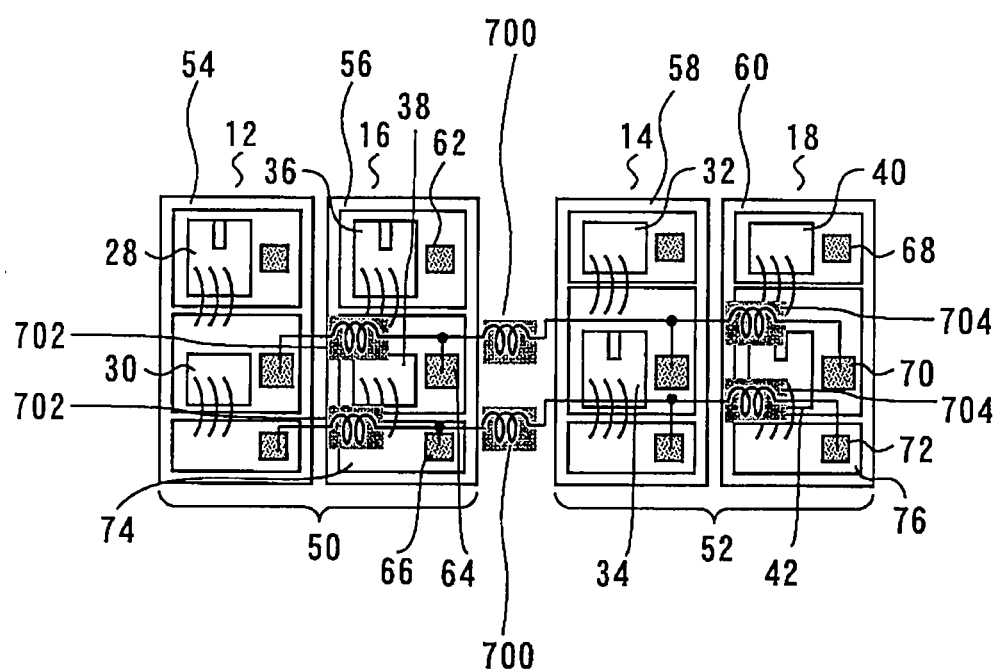
FIG. 5 is a diagram that explains the wiring inductance.

Suppression of the unusual current during the arm short circuit by adjusting the wiring inductance is now described with reference to FIG. 5. FIG. 5 is a diagram in which the wiring inductance denoted by a circuit sign is added to the description of FIG. 2. Specifically, a wiring inductance 702 of the wiring that connects the substrates of a voltage dropping chopper circuit part 50 is shown. Also, a wiring inductance 704 of the wiring that connects the substrates of a voltage boosting chopper circuit part 52 is shown. Also, a wiring inductance 700 of the wiring that connects the voltage dropping chopper circuit part 50 and the voltage boosting chopper circuit part 52 is shown. According to the above actual layout, the above described "extending the length of the intermediate wiring such that the wiring inductance of the intermediate wiring is more than twice as great as that of the wiring for the P-terminal or the N-terminal" can be rephrased by the expression "forming the wiring inductance 700 to have a twice or more inductance compare to that of the wiring inductance 702 or 704". In this case, the wiring for the P-terminal is equivalent to the wiring inductance 702, the wiring for the N-terminal is equivalent to the wiring inductance 704, and the intermediate wiring is equivalent to the wiring inductance 700.

Second Embodiment

Figure 6:
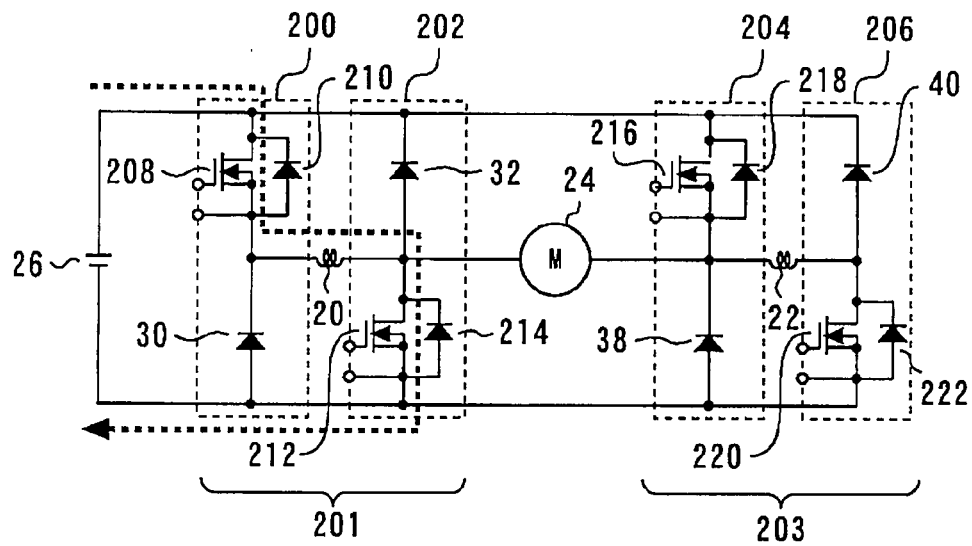
FIG. 6 is a circuit diagram that explains the semiconductor switching device including the power MOSFET.
Figure 7:
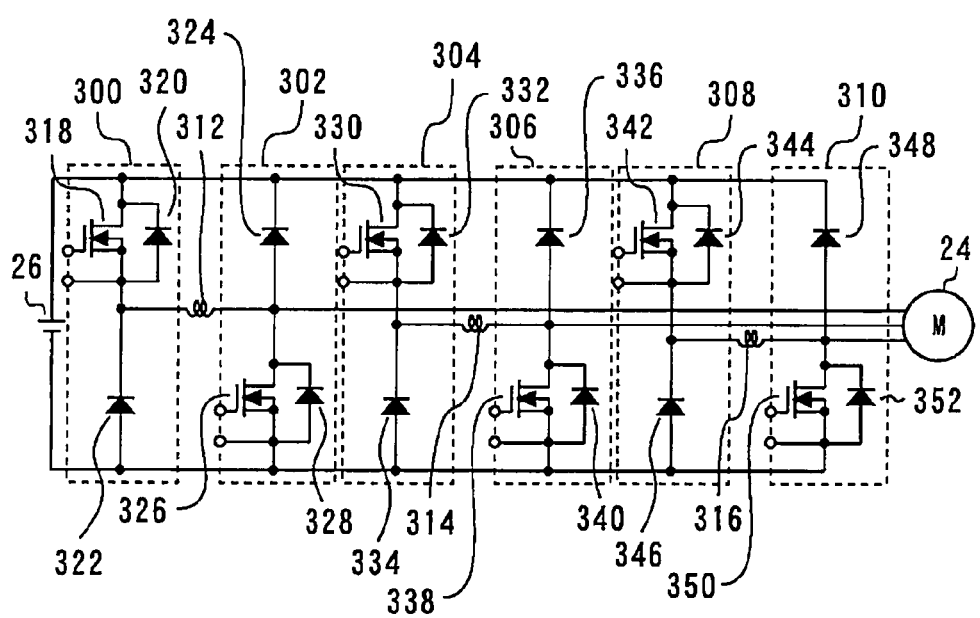
FIG. 7 is a diagram that explains the three-phase AC inverter.

The second embodiment will now be described with reference to FIGS. 6 and 7. FIG. 6 is explained firstly. Although a Semiconductor switching device shown in FIG. 6 is almost identical to the semiconductor switching device shown in FIG. 1, there is a difference in a semiconductor element. Namely, a first switching element 208, a second switching element 212, a third switching element 216 and a fourth switching element 220 are composed of a power MOSFET, respectively in this embodiment. Here, parasitic diodes 210, 214, 218 and 222 connected parallelly and inversely to each of the switching elements are shown only for the purpose of explaining the reverse conduction of the power MOSFET. Therefore, the parasitic diodes are not independently arranged actually.

Here, the operation of the semiconductor switching device will be described. First of all, the first switching element 208 and the fourth switching element 220 are set in the ON state so as to execute the PWM control of the load 24. Next, when the first switching element 208 is set in the OFF state, the energy stored in the load 24 is released as a freewheeling current that passes through the fourth switching element 220, the first diode 30, and the parasitic diode 214.

Next, when the first switching element 208 is set in the ON state again under this condition, a recovery current flows through the first diode 30 and the parasitic diode 214. The recovery current in the parasitic diode 214 flows, along a path indicated by the dashed arrow in FIG. 6, via the inductance 20. Therefore, the recovery current in the parasitic diode 214 is suppressed by the inductance 20. Therefore it is possible to reduce the turn on switching loss and the recovery loss drastically, since the recovery current is suppressed until the completion of the turn on operation of the first switching element 208.

Although the recovery current in the parasitic diode 214 is explained here, recovery current in the other parasitic diodes are also suppressed by the inductance.

Although the present embodiment has been described with reference to the example of the bridge circuit, the present invention is not limited to this and various transformations may be performed. For example, as shown in FIG. 7, the recovery current in the parasitic diode is generated even when the semiconductor switching device is consists of a three-phase AC inverter circuit. Even in such case, the recovery current can be suppressed by the inductance.

Third Embodiment

Figure 8:
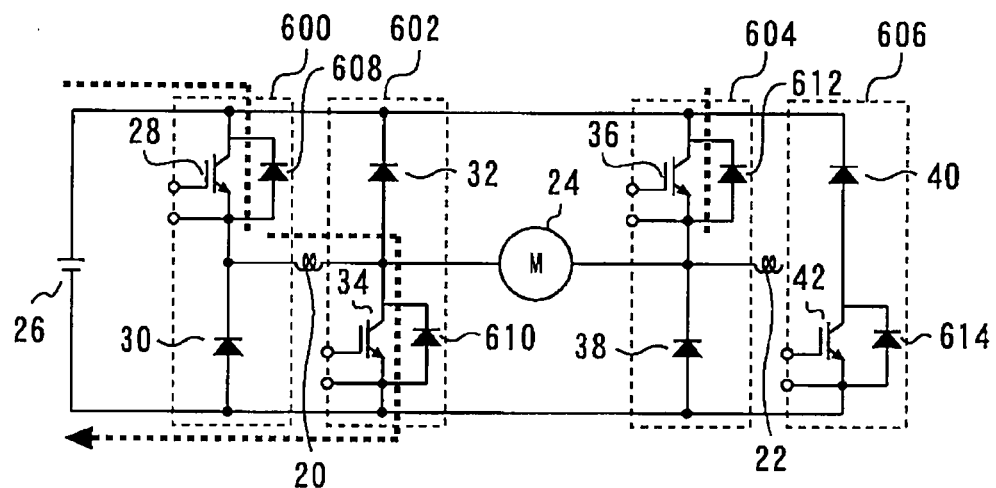
FIG. 8 shows the diode which is inverse-parallel connected to the switching elements.
Figure 9:
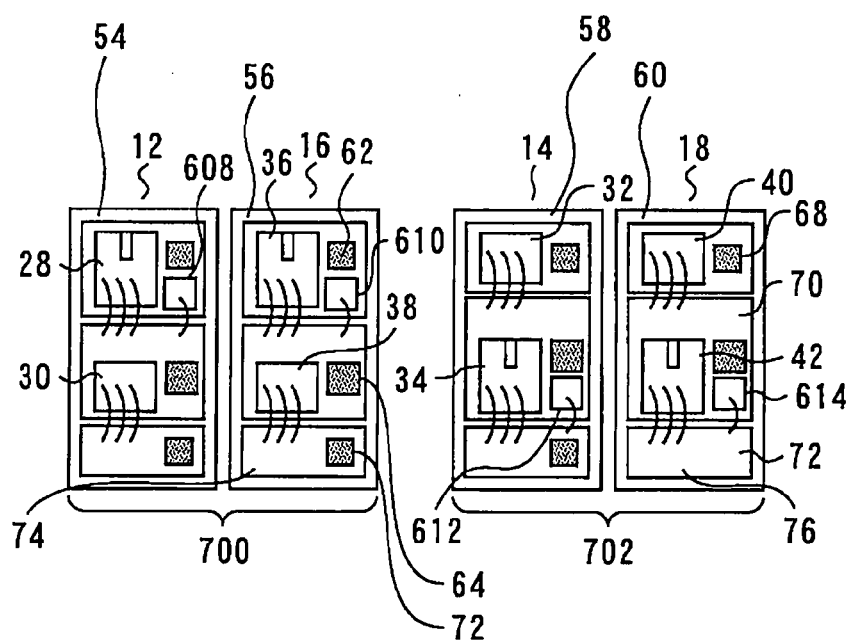
FIG. 9 shows the semiconductor switching device mounted on the substrate.

The third embodiment will now be described with reference to FIGS. 8 and 9. FIG. 8 is explained firstly.

Although a semiconductor switching device shown in FIG. 8 is almost identical to the semiconductor switching device shown in FIG. 1, they differs in that diodes 608, 610, 612 and 614 connected parallelly and inversely to each of the switching elements are provided to FIG. 8. Here, a reverse recovery charge in diode 608 connected parallelly and inversely to the first switching element 28 is lower than a reverse recovery charge in the second diode 32. This relationship is also true for the reverse recovery charge in diode 610 and the first diode 30, the diode 612 and the fourth diode 40 as well as the diode 614 and the third diode 38.

Here, a backward voltage might be momentarily applied to the switching element because of the floating impedance of the circuit wiring. However, in this embodiment, the above mentioned backward voltage, that might be momentarily applied to the switching elements, can be avoided by small diodes (diodes 608, 610, 612, 614) which is connected parallelly and inversely to each switching elements. Such configuration works as the protection against the reverse voltage especially for the switching element which has no reverse conduction.

A chip layout of the small diodes (diodes 608, 610, 612, 614) is shown in FIG. 3. The advantage for preparing the substrates for voltage dropping/boosting chopper circuits separately is same as the embodiment 1.

Fourth Embodiment

Figure 10:
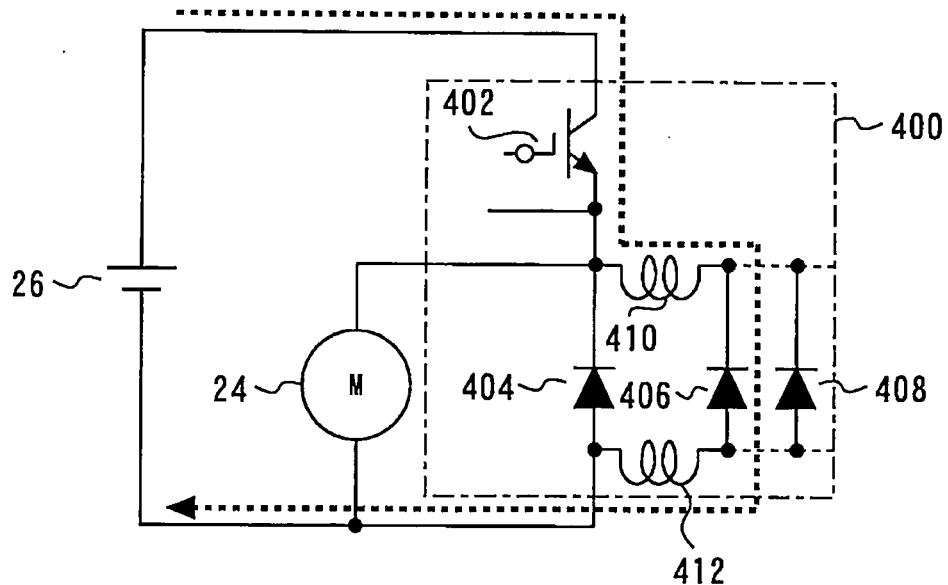
FIG. 10 is a circuit diagram that explains the semiconductor switching device of the fourth embodiment.

The fourth embodiment will now be described with reference to FIGS. 10 and 11. FIG. 10 is explained firstly. A semiconductor switching device of the present embodiment includes a voltage dropping chopper circuit 400. A switching element 402 and a diode 404 are provided for the voltage dropping chopper circuit 400. A first end of the switching element 402 is connected to the high voltage side of the DC source 26, and the second end thereof is connected to a cathode of the diode 404. An anode of the diode 404 is connected to the low voltage side of the DC source 26.

Further, a first free wheeling diode 406 and a second free wheeling diode 408 are provided for the voltage dropping chopper circuit 400. A cathode of the first free wheeling diode 406 is connected to the midpoint between the switching element 402 and the diode 404 via a first inductor 410. An anode of the first free wheeling diode 406 is connected to a anode of the diode 404. Similarly, the second free wheeling diode 408 is connected to above mentioned midpoint and the diode 404 via the first inductor 410 and a second inductor 412.

A first end of the load 24 is connected to the above mentioned midpoint, and a second end thereof is connected to the low voltage side of the DC source 26. The operation of the semiconductor switching device, which includes the voltage dropping chopper circuit 400, is now explained.

First, the switching element 402 is set in the ON state and the current is provided to the load 24. Next, when the switching element 402 is set in the OFF state, the energy stored in the load 24 is released as the forward current via the diode 404, the first free wheeling diode 406 and the second free wheeling diode 408. Next, when the switching element 402 is set in the ON state again, the recovery current flows through the diode 404, the first free wheeling diode 406 and the second free wheeling diode 408.

In general, in case that the energy stored in the load is released by a diode, VF characteristic is often lowered by using a large sized chip diode or parallelly connected diodes for the purpose of lowering the steady loss. However, use of the large sized chip diode or parallelly connected diodes causes the larger switching loss because of the increase in the recovery current. Thus, there was a problem, especially for a circuit operating at high switching frequency, that the switching loss increases.

According to the configuration of the present embodiment, the above problem can be solved. That is, the steady loss can be decreased because the VF characteristic is lowered by the forward current flowing through the diode 404, the first free wheeling diode 406 and the second free wheeling diode 408 when a free wheeling current flows. On the other hand, as for the recovery current, since the recovery current flows through the first free wheeling diode 406 and the second free wheel diode 408 via the first inductance 410 and the second inductance 412, the recovery current can be controlled as a whole. As a result, the switching loss caused by the recovery current can be suppressed.

Although in this embodiment two free wheeling diodes are connected to the diode 404 via the inductor, the number of the free wheeling diode is not limited to this.

Figure 11:
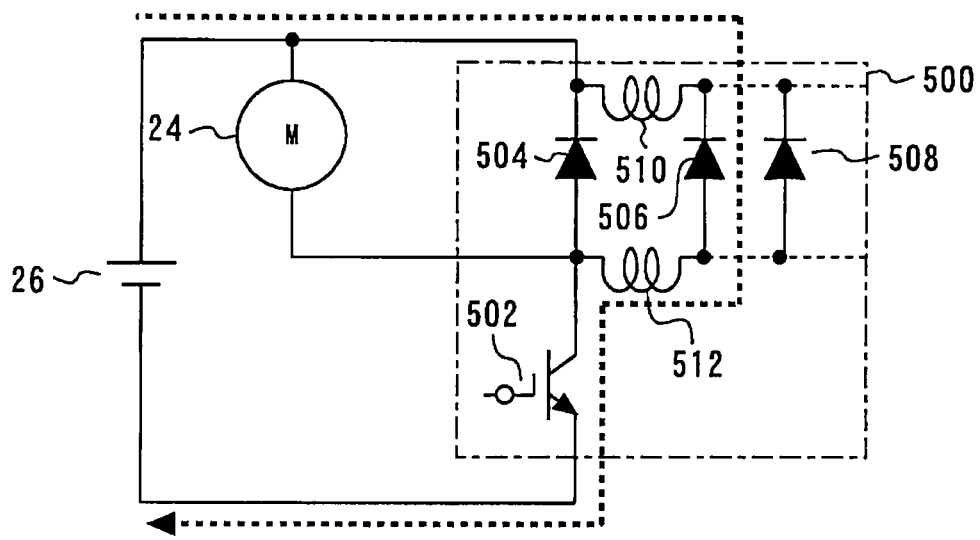
FIG. 11 is a circuit diagram that explains the voltage boosting chopper circuit.

Further, as shown in FIG. 11, this invention may be applied to a voltage dropping chopper circuit 500. In this case, as is obvious from FIG. 11, a first free wheeling diode 506 and a second free wheeling diode 508 are connected to a diode 504 via a first inductance 510 and a second inductance 512.

The semiconductor elements explained in all the embodiments until here such as the diode or the switching element may be made of SiC. If SiC is adopted as the material, the withstand voltage can be enhanced, and the current density that can be allowed in the real operation can be enhanced. Therefore the semiconductor element can be miniaturized and thus the entire semiconductor switching element can be miniaturized compared with the case wherein the Si is adopted as the material.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2009-039507, filed on Feb. 23, 2009 including specification, claims, drawings and summary, on which the Convention priority of the present application is based, are incorporated herein by reference in its entirety.

What is claimed is:

1. A semiconductor switching device comprising:
a voltage dropping chopper circuit which includes a switching element, a diode, and a free wheeling diode whose cathode is connected to a cathode of the diode via a first inductance and whose anode is connected to a anode of the diode via a second inductance; wherein
a first end of the switching element is connected to a high voltage side,
a second end of the switching element is connected to a cathode of the diode,
an anode of the diode is connected to a low voltage side,
the second end of the switching element is connected to a load, and
the load is connected to the low voltage side.

2. The semiconductor switching device as claimed in claim 1, wherein the switching element or the diode is made of SiC.

3. A semiconductor switching device comprising:
a voltage boosting circuit which includes a switching element, a diode, and a free wheeling diode whose cathode is connected to a cathode of the diode via a first inductance and whose anode is connected to a anode of the diode via a second inductance; wherein
the cathode of the diode is connected to a high voltage side,
the anode of the diode is connected to a first end of the switching element,
a second end of the switching element is connected to a low voltage side,
the first end of the switching element is connected to a load, and
the load is connected to the high voltage side.

* * * * *